United States Patent [19]

Kraus et al.

[11] Patent Number: 4,688,151
[45] Date of Patent: Aug. 18, 1987

[54] MULTILAYERED INTERPOSER BOARD FOR POWERING HIGH CURRENT CHIP MODULES

[75] Inventors: Charles J. Kraus, Poughkeepsie; Herbert I. Stoller, Wappingers Falls; Leon L. Wu, Hopewell Junction, all of N.Y.

[73] Assignee: International Business Machines Corporation, Armonk, N.Y.

[21] Appl. No.: 838,065

[22] Filed: Mar. 10, 1986

[51] Int. Cl.$^4$ .................................. H05K 5/00
[52] U.S. Cl. ........................... 361/405; 361/407; 361/412; 361/414; 439/68
[58] Field of Search ............... 361/405, 400, 403, 404, 361/407, 395, 408, 410, 412, 413, 414, 386, 387, 388; 339/17 C, 17 CF, 17 E, 17 LM, 17 M, 17 N, 176 MP, 193 R; 174/52 FP

[56] References Cited

U.S. PATENT DOCUMENTS

| | | | |
|---|---|---|---|
| 2,740,097 | 3/1956 | Edelman | 361/412 |
| 3,072,874 | 1/1963 | Roney | 361/412 |
| 4,054,939 | 10/1977 | Ammon | 361/414 |
| 4,150,421 | 4/1979 | Nishihara | 361/414 |
| 4,322,778 | 3/1982 | Barbour | 361/414 |

OTHER PUBLICATIONS

IBM Technical Disclosure Bulletin, vol. 24, No. 9, Feb. 1982, "Bus for Breadboards" by M. A. Schappert, pp. 4488–4489.

Primary Examiner—G. P. Tolin
Attorney, Agent, or Firm—Robert J. Haase

[57] ABSTRACT

A multilayered interposer powering board is disclosed for the distribution of required voltage levels to integrated circuit chip modules under conditions of high current demand and heat induced expansions. The interposer board is introduced between the module and its module mounting board. Flexible connector fingers are intermetallically or ohmically connected between a given level of the interposer board and a given power level of the module.

6 Claims, 1 Drawing Figure

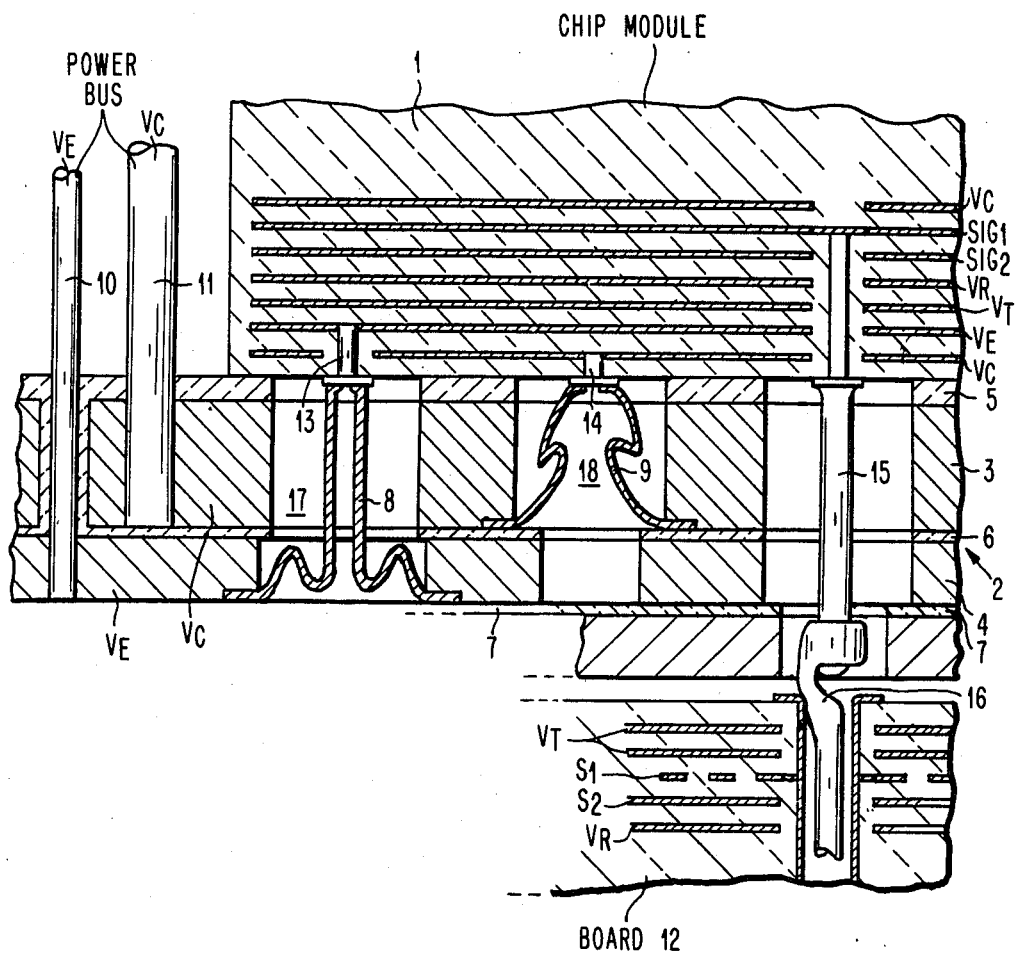

MULTILAYERED INTERPOSER BOARD FOR POWERING HIGH CURRENT CHIP MODULES

BACKGROUND OF THE INVENTION

1. Field of the Invention

The present invention generally relates to the distribution of required voltage levels to integrated circuit chip modules and, more particularly, to a structure for making such distribution under conditions of high current demand.

2. Description of the Prior Art

Power bus techniques are known for supplying operating voltages to a multiplicity of devices mounted on a common carrier or module to avoid the need for a maze of individual voltage supply wire connections to each of the devices.

For example, U.S. Pat. No. 3,072,874, issued Jan. 8, 1963 to E. L. Roney for Chassis Construction shows a plurality of sheet-like conductors separated by insulator sheets stacked and secured to the underside of a multi-vacuum tube chassis. One end of the sheet conductors are connected to external power supplies. The sheet conductors function as planar bus bars and provide common electrical connections for the vacuum tube sockets terminals. Those tube socket terminals requiring a given voltage supply input are directly connected to an appropriate one of the underlying stacked sheets via vertical openings through the intervening stacked sheets. Connection is made by spring contacts or prongs extending downwardly from the tube socket. The prongs mate with tabs which protrude into the opening and are fixed to the appropriate sheet. Although the technique avoids the disadvantages of a maze of separate wire conductors interconnecting the several stages of a multi-tube equipment to common power supplies, no provision is made for accommodating large currents and the resulting heat-induced expansion mismatches between the chassis and the power busses.

In another application involving a circuit breadboard, a similar insulated multilayer power bus structure is provided underneath the breadboard for supplying circuit operating voltages, as shown in the IBM Technical Disclosure Bulletin article "Bus for Breadboards", by M. A. Schappert, Vol. 24, No. 9, February 1982, pages 4488-4489. The different layers of the power bus structure are connected to the required terminals of the breadboard by insulated conducting pins of appropriate length that extend downwardly through holes in the structure and make spring pressure contact with respective layers. Again, however, no provision is made for high current or for the resulting thermal expansion mismatch between breadboard and power bus structure.

Summary of the Invention

With the advent of very large scale integration chips in high performance monolithic integrated circuits and with the evolvement of modules for packaging and powering large numbers of such chips, a need has been found not only to efficiently apply the operating voltages to the respective module input points but also to do so while supplying the attendant large currents and while accommodating the inevitable heat-induced expansions.

In accordance with the present invention, the above need is met by the provision of a multilayered interposer power board introduced between the module and its module mounting board for powering various levels of a chip module at high current but low voltage drop values without expansion-induced damage to power bus-to-module connections. Such connections are made through via holes in the interposer power board using flexible connector fingers which are intermetallically or ohmically connected between a given layer of the interposer power board and a given level of the module the former being edge-connected to the power bus. Unequal thermal expansion is accommodated by dimensioning the via holes to allow for movement of the fingers without undesired contact with the interposer power board levels. Low current connections to the module pass directly through the interposer to the underlying mounting board, which handles some power and all signal.

BRIEF DESCRIPTION OF THE DRAWING

The sole FIGURE is a simplified cross-sectional view of the interposer power board of the present invention in operating relationship with a power bus, a module and a module mounting board.

BEST MODE FOR CARRYING OUT THE INVENTION

Referring to the FIGURE, the distribution of large currents (of the order of 1,000's of amperes) to high performance chip modules such as module 1 (without objectionable voltage drop and while accommodating non-uniform expansion of the structure due to temperature cycling) is achieved by the provision of multi-layered interposer 2 placed between each chip module 1 and board 12 on which the modules are mounted. Interposer 2 comprises copper or copper alloy sheets such as sheets 3 and 4 insulated by layers 5, 6 and 7. Sheets 3 and 4 are thicker (for greater conductivity) than the sheets of the module 1, consistent with the different currents passing through sheets 3 and 4, so as to keep voltage drops to an acceptable minimum across the interposer sheets extending between locations contacted by the connection fingers, such as fingers 8 and 9, and the respective power busses 10 and 11. In a representative case, sheet 3 is 50 mils thick and sheet 4 is 25 mils thick.

It is to be understood that each of the sheets 3 and 4 is tapped (or connected to) at a multiplicity of points throughout their respective surface areas wherever a chip powering metal level $V_E$ or $V_C$ is to be contacted in overlying chip module 1. In the simplified example shown, only two connections are illustrated, i.e., fingers 8 (which establish connection between sheet 4 of interposer 2 and $V_E$ level of module 1) and fingers 9 (which establish connection between sheet 3 of interposer 2 and the $V_C$ level of module 1). Fingers 8 and 9 are intermetallically or ohmically joined, as by welding or by soldering to rods 13 and 14 and then to their respective module powering planes $V_E$ and $V_C$.

The remaining low power levels ($V_T$ and $V_R$) and the low power signal I/O's of module 1 use normal pin connections, such as connection 15 which penetrates completely through interposer power board 2 without making any electrical connection thereto. Contact to the appropriate level of board 12 is completed via clamp 16 in a conventional manner.

The spring-like shape of fingers 8 and 9 is selected to allow for relative motion between module 1 and interposer 2. Such motion occurs during normal operation due to heat-induced differential expansion as well as during rework handling when chips (not shown) are replaced in the modules.

While the invention has been particularly shown and described with reference to the preferred embodiments thereof, it will be understood by those skilled in the art that various changes in form and detail may be made therein without departing from the spirit and scope of the invention.

What is claimed is:

1. An interposer board positioned between a multilayered module and a module mounting board,
    said module having a plurality of chip powering levels and signal path levels for servicing a plurality of semiconductor circuit chips,
    said interposer board comprising a plurality of insulated current-carrying conductive planes of greater conductivity than said powering levels of said module,
    groups of flexible contacting members,
    each said plane being apertured and receiving one of said groups of flexible contacting members, each member of the same group, at one end, being ohmically connected to a respective first location on a respective plane and, at the other end, to a respective second location on an associated powering level,
    said first locations being at a multiplicity of points throughout the surface area of the respective plane.

2. The interposer board defined in claim 1 wherein each said aperture is of sufficient dimensions to accommodate displacement of the respective member due to thermal expansion without causing contact between said respective member and any plane other than the plane to which it is ohmcally connected.

3. The interposer board defined in claim 1 wherein said planes are further apertured to allow passage of conductors from said signal path levels through said interposer board without contacting any of said planes.

4. The interposer board defined in claim 1 wherein each said aperture is of sufficient dimensions to accommodate displacement of the respective member due to thermal expansion without causing contact between said respective member and any plane other than the plane to which it is ohmically connected, and
    said planes are further apertured to allow passage of conductors from said signal path levels through said interposer board without contacting any of said planes.

5. The interposer board defined in claim 1 and further including a respective power bus connected to each of said planes for applying power thereto.

6. The interposer board defined in claim 1 wherein each of said planes comprises copper.

* * * * *